United States Patent
Huang

(10) Patent No.: US 9,092,202 B2
(45) Date of Patent: Jul. 28, 2015

(54) MOBILE STORAGE DEVICE

(71) Applicant: INNOSTOR TECHNOLOGY CORPORATION, Hsinchu County (TW)

(72) Inventor: Chih Sheng Huang, Hsinchu County (TW)

(73) Assignee: SK Hynix Inc., Gyeonggi-do (KR)

( * ) Notice: Subject to any disclaimer, the term of this patent is extended or adjusted under 35 U.S.C. 154(b) by 349 days.

(21) Appl. No.: 13/861,573

(22) Filed: Apr. 12, 2013

(65) Prior Publication Data

US 2014/0307381 A1    Oct. 16, 2014

(51) Int. Cl.
*G06F 1/18* (2006.01)
*G06F 1/20* (2006.01)
*G06F 3/06* (2006.01)

(52) U.S. Cl.
CPC .. *G06F 1/20* (2013.01); *G06F 1/18* (2013.01); *G06F 3/0679* (2013.01)

(58) Field of Classification Search
CPC ............ G06F 1/18; G06F 1/20; G06F 3/0679
See application file for complete search history.

(56) References Cited

U.S. PATENT DOCUMENTS

2014/0055940 A1* 2/2014 Chen et al. ............... 361/679.32

FOREIGN PATENT DOCUMENTS

JP          09069196 A  *  3/1997

* cited by examiner

*Primary Examiner* — Ramon Barrera
(74) *Attorney, Agent, or Firm* — William Park & Associates Ltd.

(57) ABSTRACT

A mobile storage device is used for coupling to a host device via a communication interface. The mobile storage device receives power from the host device. The mobile storage device includes a substrate, a resistive circuit and a first integrated circuit. The substrate includes at least a first heat-dissipation slot. The resistive circuit is disposed around the first heat-dissipation slot of the substrate. The resistive circuit is coupled to a voltage source of the host device. The first integrated circuit is disposed on the substrate. The first integrated circuit is coupled to the resistive circuit, so as to receive power which is stepped-down by the resistive circuit.

10 Claims, 5 Drawing Sheets

MOBILE STORAGE DEVICE

BACKGROUND

1. Technical Field

The present disclosure relates to a mobile storage device, in particular, to a mobile storage device that can increase heat dissipation capability.

2. Description of Related Art

A mobile storage device (e.g. a USB flash disk) generally possesses a Universal Serial Bus (USB). When the mobile storage device is coupled to a host device, the mobile storage device is operated by the power supplied by the USB and the mobile storage device exchanges data with the host device via the USB. The current USB mainstreams are USB 2.0 and USB 3.0, which are the second version and the third version of the USB respectively.

An operating voltage used for the USB is 5V (volt). However, operating voltages for a sub-circuit and an integrated circuit (IC), such as the core IC or the flash memory component, of the circuitry in the mobile storage device are usually lower than 5V. Hence, a buck circuit is usually utilized for lowering the voltage from 5V to, for instance, 1.2V or 3.3V. The buck circuit can utilize a Low DropOut linear regulator (LDO) or a pulse width modulation (PWM) circuit, wherein cost of the LDO is relatively cheaper.

Please refer to FIG. 1. FIG. 1 is a circuit block diagram of a buck circuit of a conventional mobile storage device. As shown in FIG. 1, a LDO 101 lowers a voltage of 5V to 3.3V. A LDO 102 further lowers the voltage of 3.3V to 1.2V. The voltage of 1.2V can then be supplied to a core IC (i.e. the operating voltage can also be 1.8V or 1.0V, etc., according to implementation variation of the core IC). A LDO 103 lowers the voltage of 5V to 3.3V, and the voltage of 3.3V can be supplied to a flash memory component or an input/output (I/O) port in the circuitry of the mobile storage device. Power loss P for each of the LDOs 101, 102 and 103 can be represented by a formula of $P=\Delta V*I$, wherein $\Delta V$ represents a voltage difference generated by the LDO and I represents a current flowing through the LDO. For instance, when the current flowing through the LDOs 101 and 102 is 150 mA (milliamp), the total power loss for the LDOs 101 and 102 is (5V−1.2V)*150 mA=570 mW (milliwatt). When the current flowing through the LDO 103 is 100 mA (milliamp), the total power loss for the LDO 103 is (5V−3.3V)*100 mA=170 mW (milliwatt). Power loss (it will be converted to heat) of a LDO increases as a voltage drop of the LDO increases, and consequently the LDO generates more heat.

SUMMARY

An exemplary embodiment of the present disclosure provides a mobile storage device for being coupled to a host device via a communication interface and receiving power from the host device. The mobile storage device comprises a substrate, a resistive circuit and a first integrated circuit (IC). The substrate comprises at least a first heat-dissipation slot. The resistive circuit is disposed around the first heat-dissipation slot of the substrate and coupled to a voltage source of the host device. The first integrated circuit (IC) is disposed on the substrate and coupled to the resistive circuit, so as to receive power which is stepped-down by the resistive circuit.

According to one exemplary embodiment of the present disclosure, the above mentioned mobile storage device further comprises a second heat-dissipation slot, wherein the second heat-dissipation slot is disposed between the resistive circuit and the first IC.

According to one exemplary embodiment of the present disclosure, the above mentioned resistive circuit is disposed across the first heat-dissipation slot.

According to one exemplary embodiment of the present disclosure, the above mentioned resistive circuit comprises a plurality of resistive components, and the plurality of resistive components is coupled in series or in parallel to each other.

According to one exemplary embodiment of the present disclosure, the above mentioned second heat-dissipation slot is a bar-shaped slot, an L-shaped slot or a U-shaped slot.

According to one exemplary embodiment of the present disclosure, the communication interface of the above mentioned mobile storage device is a Universal Serial Bus (USB) and the mobile storage device receives the power from the host device via the USB.

According to one exemplary embodiment of the present disclosure, a resistance of the above mentioned resistive circuit is between 5 ohm and 20 ohm.

According to one exemplary embodiment of the present disclosure, the above mentioned first IC comprises at least a Low DropOut linear regulator (LDO).

According to one exemplary embodiment of the present disclosure, the above mentioned mobile storage device further comprises a second IC, disposed on the substrate, and the second IC is electrically connected to the first IC and coupled to the resistive circuit, so as to receive the power which is stepped-down by the resistive circuit.

According to one exemplary embodiment of the present disclosure, the above mentioned mobile storage device further comprises a second IC, disposed on the substrate, the second IC is electrically connected to the LDO of the first IC, so as to receive power which is stepped-down by the LDO.

In summary, the embodiment of the present disclosure provides a mobile storage device. The resistive circuit of the mobile storage device can provide the functionality to step-down voltage, and the resistive circuit can decrease the heat loss of the first IC at the same time. The mobile storage device can transfer the heat generated by the resistive circuit via air conduction, by means of the first heat-dissipation slot of the substrate. The second heat-dissipation slot of the substrate can prevent the heat generated by the resistive circuit from being transferred to the first IC. Hence, the operating temperature of the mobile storage device and the first IC thereof can be decreased.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
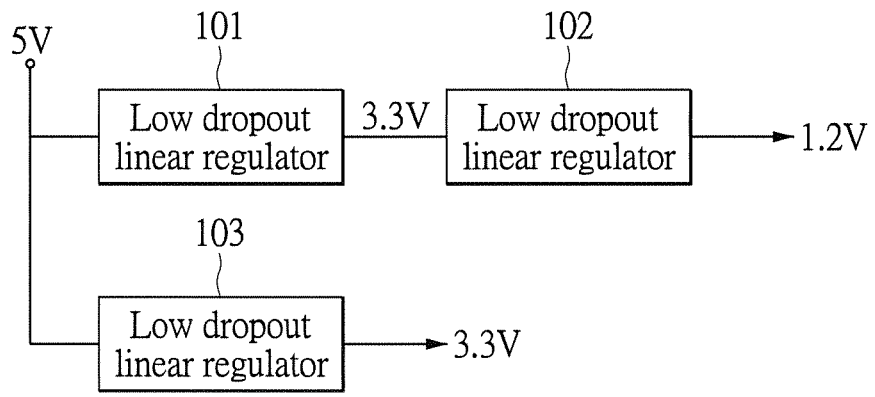
FIG. 1 is a circuit block diagram of a buck circuit of a conventional mobile storage device.

Reference will now be made in detail to the exemplary embodiments of the present disclosure, examples of which are illustrated in the accompanying drawings. Wherever possible, the same reference numbers are used in the drawings and the description to refer to the same or like parts.

(An Embodiment of a Mobile Storage Device)

Figure 2:
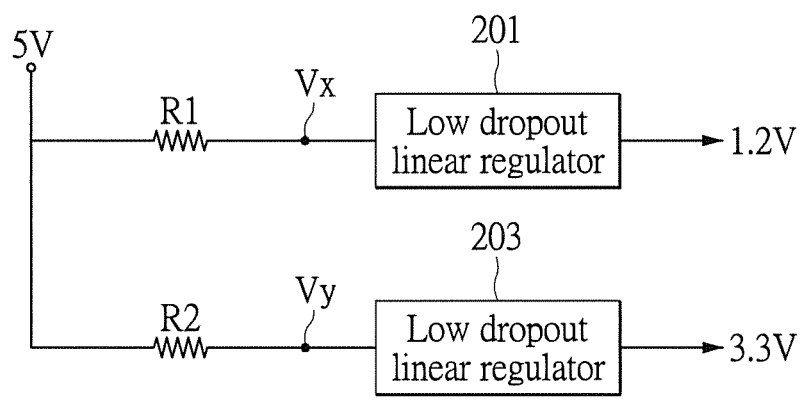
FIG. 2 is a circuit block diagram of a buck circuit of a mobile storage device according to an embodiment of the present disclosure.

Please refer to FIG. 2. FIG. 2 is a circuit block diagram of a buck circuit of a mobile storage device according to an embodiment of the present disclosure. A difference between the buck circuit shown in FIG. 2 and the buck circuit shown in FIG. 1 is that a resistor R1 (or a resistive circuit) is coupled between a voltage source of 5V (volt) and a low dropout linear regulator (LDO) 201, and a resistor R2 (or a resistive circuit) is coupled between the voltage source of 5V and a low dropout linear regulator (LDO) 203.

The LDO 201 provides a low voltage of 1.2V to a core integrated circuit (IC). The LDO 201 is usually integrated in the core IC, so that if a voltage difference of the LDO 201 gets larger, the core IC will generate more heat which needs to be dissipated. Similarly, a low voltage of 3.3V generated by the LDO 203 can be provided to a flash memory component or an I/O port in the circuitry of the mobile storage device.

Figure 3:
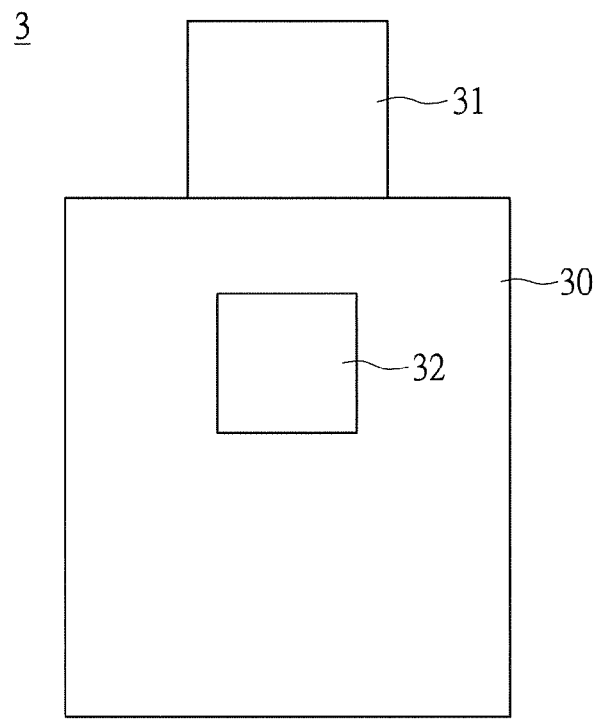
FIG. 3 is a schematic diagram illustrating a mobile storage device according to an embodiment of the present disclosure.

Please refer to FIG. 3. FIG. 3 is a schematic diagram illustrating a mobile storage device according to an embodiment of the present disclosure. As shown in FIG. 3, the mobile storage device 3 comprises a substrate 30, a communication interface 31 and a first IC 32. The substrate 30 carries the communication interface 31 and the first IC 32. The first IC 32 comprises an LDO (such as the LDO 201 shown in FIG. 2) and a core circuit unit, etc. The first IC mentioned above usually transfers the heat generated during circuit operations to the substrate 30 by means of heat conduction. At this moment the overall temperature of the circuit substrate 30 increases accordingly. The substrate 30 can be a PCB (printed circuit board) or an IC carrier board, for instance.

Please refer back to FIG. 2. Voltages across the resistors R1 and R2 (or called as resistive circuit) will cause voltages of input terminals Vx and Vy of the respective LDOs 201 and 203 to be lower than 5V, so heat loss of the LDOs 201 and 203 can be decreased. At the same time, voltages across the resistors R1 and R2 (or called as resistive circuit) would also cause heat loss. However, the resistors R1 and R2 (or called as resistive circuit) and the circuitry such as the core IC circuit or the flash memory component can be disposed independently on the circuit substrate. The present disclosure discloses an implementation mode for preventing a temperature of the circuit substrate from increasing, while improving the heat dissipation of the resistors R1 and R2 (or called as resistive circuit). For instance, voltages of the input terminals Vx and Vy of the LDOs 201 and 203 are 3.5V, currents flowing through the LDOs 201 and 203 are 105 mA and 100 mA respectively. At this moment, power loss (or heat loss) of the LDO 201 is (3.5V−1.2V)*150 mA=345 mW, and power loss (or heat loss) of the LDO 203 is even lower.

Figure 4:
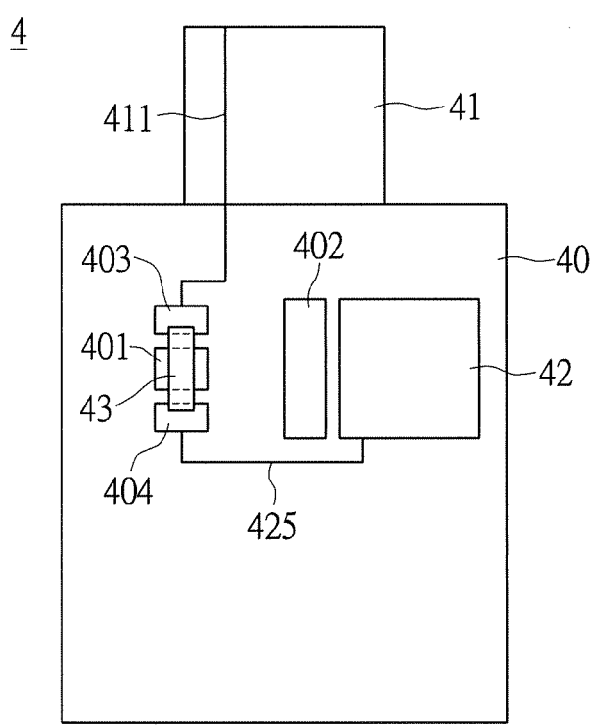
FIG. 4 is a schematic diagram illustrating a mobile storage device according to another embodiment of the present disclosure.

Please refer to FIG. 4. FIG. 4 is a schematic diagram illustrating a mobile storage device according to another embodiment of the present disclosure. The mobile storage device 4 is used for coupling to a host device (not illustrated) and receiving power from the host device. The mobile storage device 4 comprises a substrate 40, a communication interface 41, a resistive circuit 43 and a first IC 42. In the present embodiment, the communication interface 41 of the mobile storage device 4 is a Universal Serial Bus (USB). The mobile storage device 4 receives the power from the host device via the USB.

The substrate 40 comprises at least a first heat-dissipation slot 401 and a second heat-dissipation slot 402. The resistive circuit 43 is disposed around the first heat-dissipation slot 401 of the substrate 40. For instance, the resistive circuit 43 is disposed across the first heat-dissipation slot 401 of the substrate 40 and the resistive circuit 43 is coupled to a voltage source of the host device (not illustrated) via a wire 411. In the present embodiment, a voltage level of the voltage source of the host device is 5V. The wire 411 is connected to a power line of the USB. The first IC 42 is disposed on the substrate 40. The first IC 42 is coupled to the resistive circuit 43 via a wire 425, so as to receive the power which is stepped-down by the resistive circuit 43. The second heat-dissipation slot 402 is disposed between the resistive circuit 43 and the first IC 42. In the present embodiment, a resistance of the resistive circuit is preferably between 5 ohm and 20 ohm. The first IC 42 comprises at least one LDO.

Please refer back to FIG. 4. The resistive circuit 43 comprises at least a resistive component. All resistive components of the resistive circuit 43 can be coupled in series or in parallel to each other. In other words, the resistive circuit of the present disclosure can comprise a resistive component, or a plurality of coupled resistive components. Taking FIG. 4 as an example, the resistive circuit 43 is disposed across the first heat-dissipation slot 401. Two ends of the resistive circuit 43 are coupled to conductive contact pads 403 and 404 respectively. The resistive circuit 43 can be a SMT (Surface-Mounted Technology) component or a DIP (dual in-line package) component. For instance, pins at the two ends of the DIP component can pass through a substrate and then are welded at the other side of the substrate. The present disclosure does not limit the resistive circuit 43 to be a SMT component or a DIP component. So long as the resistive circuit 43 is disposed across the first heat-dissipation slot 401, the air inside the first heat-dissipation slot 401 can improve heat dissipation of the resistive circuit 43 via air conduction, so as to significantly decrease the proportion of heat being transferred from the resistive circuit 43 to the substrate 40.

Please refer back to FIG. 4. The second heat-dissipation slot 402 is used for preventing the heat generated by the resistive circuit 43 from being transferred to the first IC 42 via the substrate 40, by means of the air inside the second heat-dissipation slot 402 to isolate the first IC and the resistive circuit 43. It is worth mentioning that the present disclosure does not limit the number or the shape of the first heat-dissipation slot 401, nor does the present disclosure limit the shape of the second heat-dissipation slot 402. In the present embodiment, the second heat-dissipation slot 402 is a bar-shaped slot. Other embodiments of the first heat-dissipation slot 401 and the second heat-dissipation slot 402 are described below.

(Another Embodiment of the Mobile Storage Device)

Figure 5:
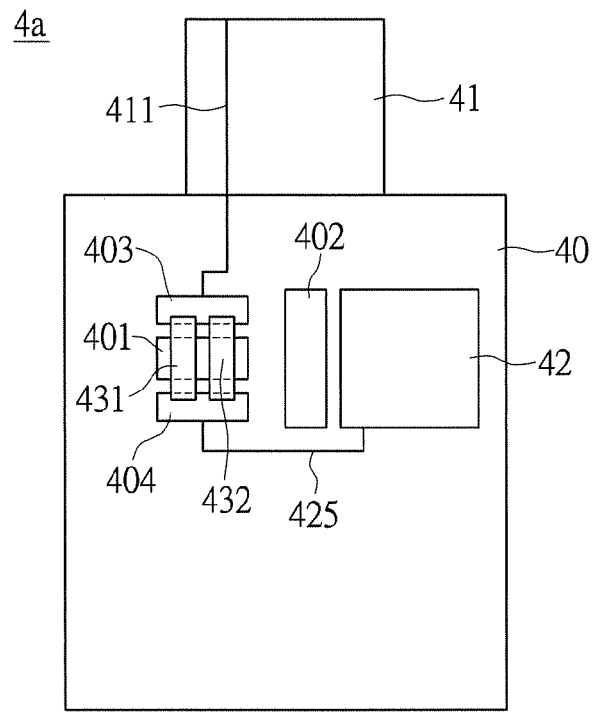
FIG. 5 is a schematic diagram illustrating a mobile storage device according to another embodiment of the present disclosure.

Please refer to FIG. 4 and FIG. 5 together. FIG. 5 is a schematic diagram illustrating a mobile storage device according to another embodiment of the present disclosure. The mobile storage device 4a shown in FIG. 5 is similar to the mobile storage device 4 shown in FIG. 4, the only difference consists in that the resistive circuit of the mobile storage device 4a comprises two resistive components 431 and 432 coupled in parallel. The resistive components 431 and 432 are both disposed across the first heat-dissipation slot 401. The resistive components 431 and 432 share the contact pads 403 and 404. Other parts of the mobile storage device 4a are similar to those of the mobile storage device 4 shown in FIG. 4, so relative descriptions are omitted hereinafter.

Another Embodiment of the Mobile Storage Device

Figure 6:
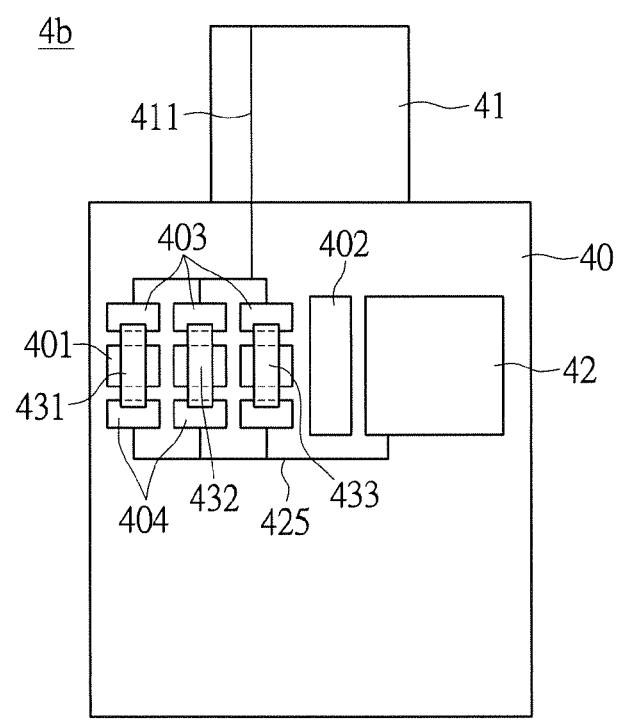
FIG. 6 is a schematic diagram illustrating a mobile storage device according to another embodiment of the present disclosure.

Please refer to FIG. 5 and FIG. 6. FIG. 6 is a schematic diagram illustrating a mobile storage device according to another embodiment of the present disclosure. The mobile storage device 4b shown in FIG. 6 is similar to the mobile storage device 4a shown in FIG. 5, except that a resistive circuit of the mobile storage device 4b comprises three resistive components 431, 432 and 433 coupled in parallel. The resistive components 431, 432 and 433 are disposed across three independent first heat-dissipation slots 401 respectively. Two ends of each of the resistive components 431, 432 and 433 are coupled to the respective contact pads 403 and 404 respectively. Other parts of the mobile storage device 4b are similar to those of the mobile storage device 4a shown in FIG. 5, so relative descriptions are omitted hereinafter.

(Another Embodiment of the Mobile Storage Device)

Figure 7:
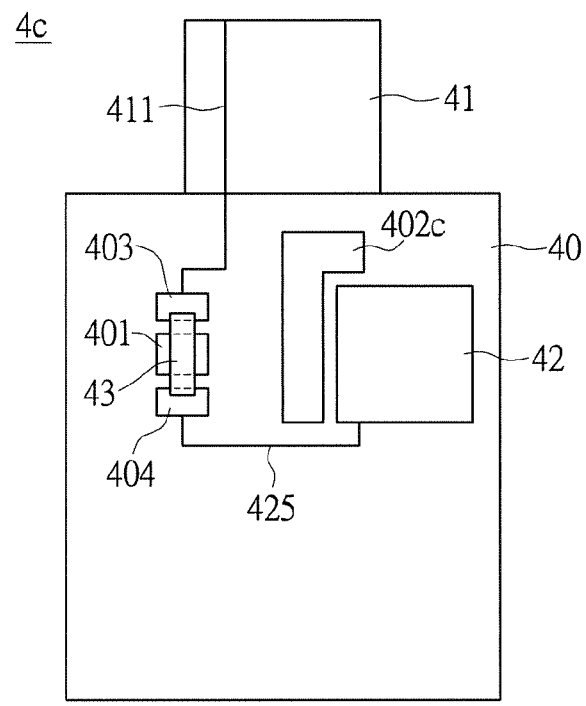
FIG. 7 is a schematic diagram illustrating a mobile storage device according to another embodiment of the present disclosure.

Please refer to FIG. 4 and FIG. 7. FIG. 7 is a schematic diagram illustrating a mobile storage device according to another embodiment of the present disclosure. The mobile storage device 4c shown in FIG. 7 is similar to the mobile storage device 4 shown in FIG. 4, except that a second heat-dissipation slot 402c of the mobile storage device 4c is an L-shaped slot. The second heat-dissipation slot 402c is disposed at a region adjacent to the first IC 42 and the resistive circuit 43 on the substrate 40. Compared to a portion of the substrate without having the second heat-dissipation slot 402c disposed, the air in the second heat-dissipation slot 402c can help preventing the heat of the resistive circuit 43 from being transferred to the first IC 42.

Figure 8:
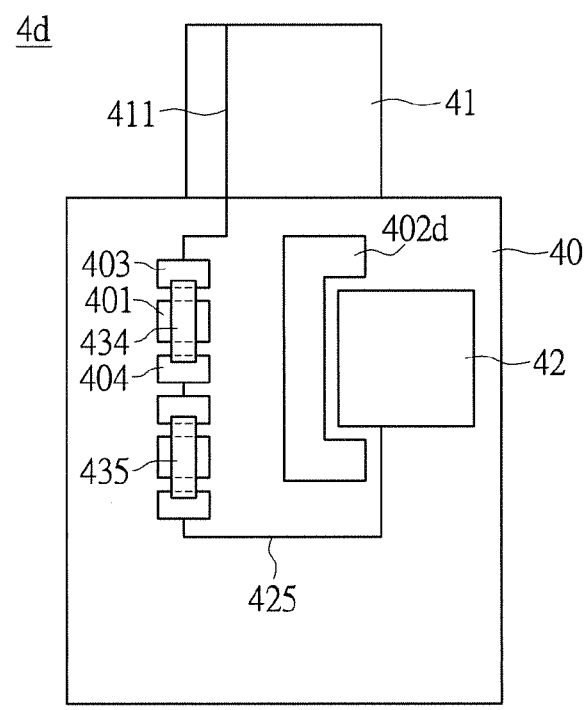
FIG. 8 is a schematic diagram illustrating a mobile storage device according to another embodiment of the present disclosure.

Please refer to FIG. 7 and FIG. 8. FIG. 8 is a schematic diagram illustrating a mobile storage device according to another embodiment of the present disclosure. The mobile storage device 4d shown in FIG. 8 is similar to the mobile storage device 4c shown in FIG. 7, except that a resistive circuit of the mobile storage device 4d comprises two resistive components 434 and 435 coupled in series. The resistive components 434 and 435 are coupled to the respective contact pads 403 and 404 respectively. A second heat-dissipation slot 402d is a U-shaped slot. A shape and a position of the second heat-dissipation slot 402d can be designed according to the resistive component comprised by the resistive circuit 43, so long as the second heat-dissipation slot 402d can separate the first IC 42 and the resistive circuit 43 (e.g. the resistive circuit 43 can be comprised by the resistive components 434 and 435 coupled in series).

(Another Embodiment of the Mobile Storage Device)

Figure 9:
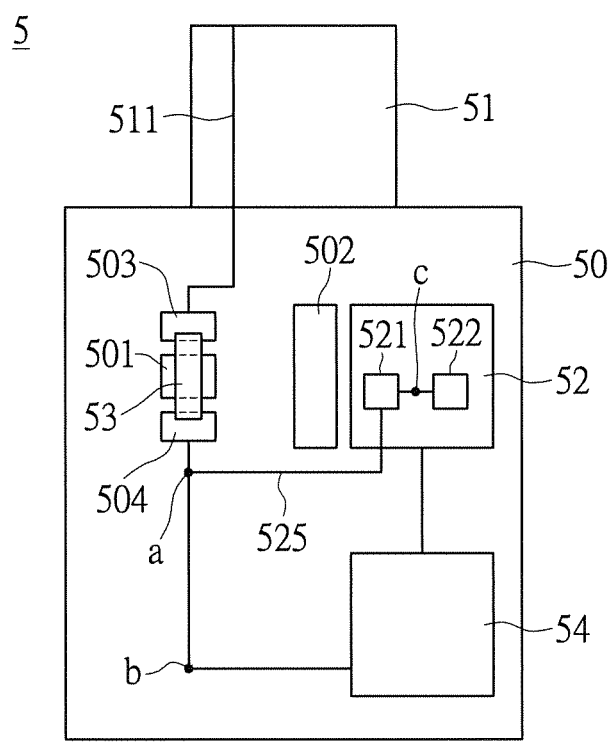
FIG. 9 is schematic diagram illustrating a mobile storage device according to another embodiment of the present disclosure.

Please refer to FIG. 2, FIG. 4 and FIG. 9. FIG. 9 is a schematic diagram illustrating a mobile storage device according to another embodiment of the present disclosure. The mobile storage device 5 comprises a substrate 50, a communication interface 51, a resistive circuit 53 and a first IC 52. The substrate 50 can be a printed circuit board (PCB) or an integrated circuit (IC) carrier board, for instance. The substrate 50 comprises a first heat-dissipation slot 501 and a second heat-dissipation slot 502. The first IC 52 comprises a LDO 521 and a core circuit unit 522. The mobile storage device 5 shown in FIG. 9 is similar to the mobile storage device 4 shown in FIG. 4, except that the mobile storage device 5 further comprises a second IC 54. The second IC 54 is disposed on the substrate 50. The second IC 54 is electrically connected to the first IC 52. The second IC 54 can be a flash memory, for instance. The second IC 54 is coupled to the resistive circuit 53, so as to receive the power which is stepped-down by the resistive circuit 54. Voltages of the nodes a and b can be, for instance, 3.3V, after being stepped-down by the resistive circuit 54. The LDO 521 further steps-down the voltage to obtain a voltage that equals, but not limited to, 1.2V, of a node c, so that such voltage can be provided to the core circuit unit 522. In addition, the second IC 54 can also receive the power provided by the first IC 52, i.e., the second IC 54 can be electrically connected to the LDO 521 of the first IC 52, so as to receive the power which is stepped-down by the LDO 521. The present disclosure, however, does not limit a source of the power required by the second IC 54.

Possible Effects of the Embodiments

In summary, the embodiment of the present disclosure provides a mobile storage device. The resistive circuit of the mobile storage device can provide the functionality to step-down a voltage, and the resistive circuit can decrease the heat loss of the first IC at the same time. The mobile storage device can transfer the heat generated by the resistive circuit via air conduction, by means of the first heat-dissipation slot of the substrate. The second heat-dissipation slot of the substrate can block the heat generated by the resistive circuit from being transferred to the first IC. In this manner, the operating temperature of the mobile storage device and the first IC thereof can be decreased.

The above-mentioned descriptions represent merely the exemplary embodiment of the present disclosure, without any intention to limit the scope of the present disclosure thereto. Various equivalent changes, alternations or modifications based on the claims of the present disclosure are all consequently viewed as being embraced by the scope of the present disclosure.

What is claimed is:

1. A mobile storage device, for coupling to a host device via a communication interface and receiving power from the host device, comprising:
   a substrate, comprising at least a first heat-dissipation slot;
   a resistive circuit, disposed around the first heat-dissipation slot of the substrate and coupled to a voltage source of the host device; and
   a first integrated circuit (IC), disposed on the substrate and coupled to the resistive circuit, so as to receive power which is stepped-down by the resistive circuit.

2. The mobile storage device according to claim 1, further comprising a second heat-dissipation slot, wherein the second heat-dissipation slot is disposed between the resistive circuit and the first IC.

3. The mobile storage device according to claim 1, wherein the resistive circuit is disposed across the first heat-dissipation slot.

4. The mobile storage device according to claim 1, wherein the resistive circuit comprises a plurality of resistive components, and the plurality of resistive components is coupled in series or in parallel to each other.

5. The mobile storage device according to claim 2, wherein the second heat-dissipation slot is a bar-shaped slot, an L-shaped slot or a U-shaped slot.

6. The mobile storage device according to claim 1, wherein the communication interface of the mobile storage device is a Universal Serial Bus (USB), and the mobile storage device receives the power from the host device via the USB.

7. The mobile storage device according to claim 1, wherein a resistance of the resistive circuit is between 5 ohm and 20 ohm.

8. The mobile storage device according to claim 1, wherein the first IC comprises at least a Low DropOut linear regulator (LDO).

9. The mobile storage device according to claim 1, further comprising a second IC, disposed on the substrate, wherein the second IC is electrically connected to the first IC and the resistive circuit, so as to receive the power which is stepped-down by the resistive circuit.

10. The mobile storage device according to claim 8, further comprising a second IC, disposed on the substrate, wherein the second IC is electrically connected to the LDO, so as to receive power which is stepped-down by the LDO.

\* \* \* \* \*